United States Patent [19]

Carney

[11] 4,352,202
[45] Sep. 28, 1982

[54] COMBINED REMOTE CONTROL FOR WIRELESS COMMUNICATION EQUIPMENT AND ASSOCIATED ANTENNA

[76] Inventor: Richard E. Carney, 6253 Longford Dr., Citrus Heights, Calif. 95610

[21] Appl. No.: 234,467

[22] Filed: Feb. 17, 1981

Related U.S. Application Data

[63] Continuation-in-part of Ser. No. 72,174, Sep. 4, 1979, abandoned.

[51] Int. Cl.³ .......................... H04B 7/08; H02P 1/04; G05B 19/20
[52] U.S. Cl. .................................. 455/151; 455/352; 318/602; 318/466; 340/825.69; 340/825.76; 343/100 AD; 358/194.1
[58] Field of Search ................................ 340/694–696, 340/171; 455/151, 352, 353; 358/194.1; 318/601, 603, 16, 602, 466–470; 343/100 AD, 754, 757, 766, 869

[56] References Cited

U.S. PATENT DOCUMENTS

| | | | |
|---|---|---|---|
| 3,465,217 | 9/1969 | Kress | 318/601 |
| 3,644,720 | 2/1972 | Falk | 318/603 |
| 3,795,851 | 3/1974 | Gage et al. | 318/602 |
| 3,826,964 | 7/1974 | Byrne | 318/603 |
| 3,918,002 | 11/1975 | Leuschner | 455/151 |
| 4,072,886 | 2/1978 | Dammeyer | 318/602 |

Primary Examiner—John W. Caldwell, Sr.
Assistant Examiner—Donnie Lee Crosland
Attorney, Agent, or Firm—Keith D. Beecher

[57] ABSTRACT

A combined remote control unit is provided for wireless communication equipment such as television receivers, frequency modulation or amplitude modulation radio receivers, or other equipment used in wireless communication systems, the remote control unit being capable of setting the equipment to any selected signal channel, and the remote control unit concomitantly causing the antenna associated with the equipment to be rotated to an angular position at which optimum signal processing in the selected channel may be effectuated.

3 Claims, 1 Drawing Figure

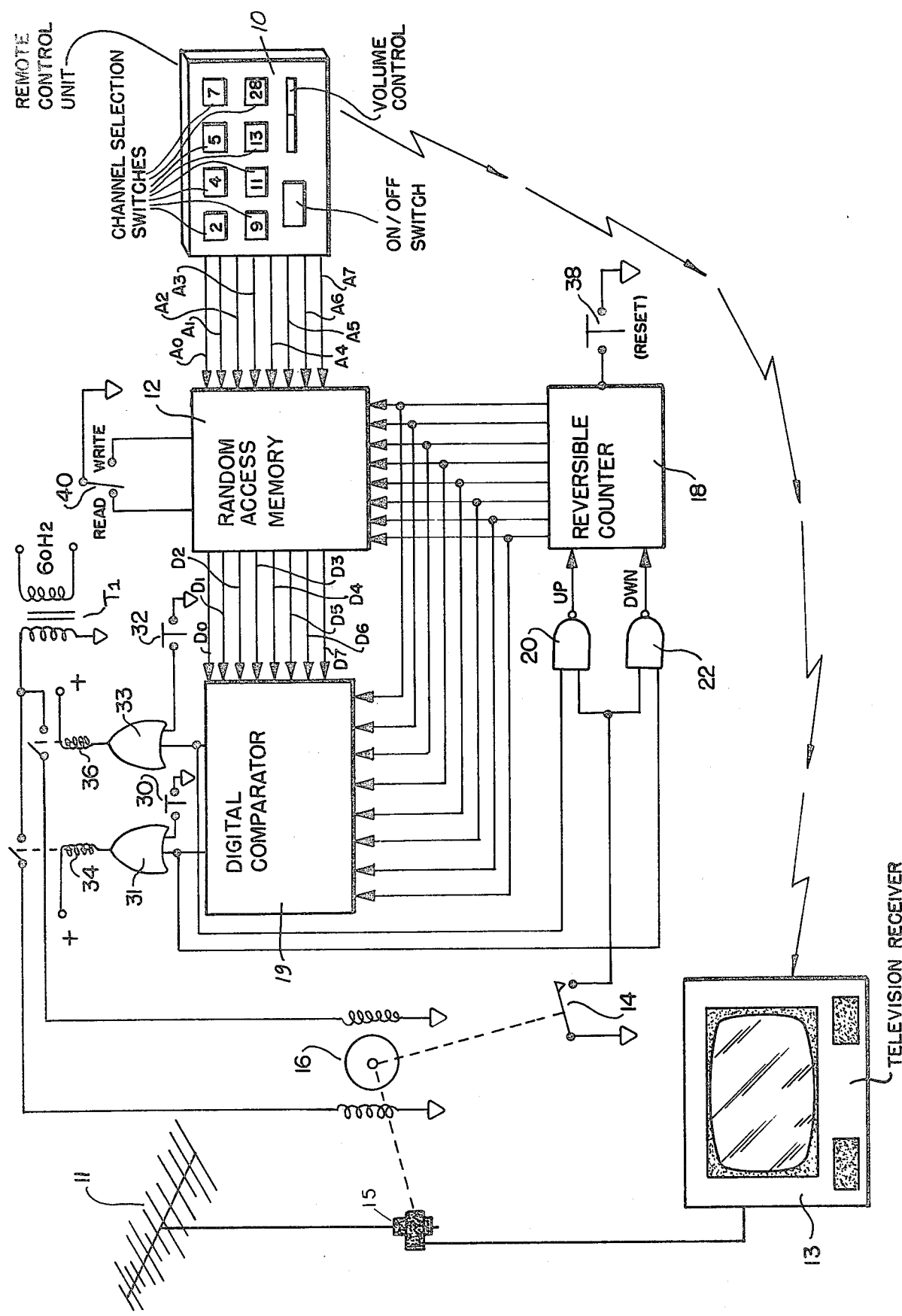

COMBINED REMOTE CONTROL FOR WIRELESS COMMUNICATION EQUIPMENT AND ASSOCIATED ANTENNA

This application is a continuation-in-part of copending Application Ser. No. 072,174 filed Sept. 4, 1979 now abandoned, in the name of the present inventor.

BACKGROUND

Antenna rotating apparatus for television receivers is known, by which the antenna is rotated by appropriate power operated means to different angular positions as the television receiver is tuned to different signal channels, so as to assure optimum reception by the receiver of each signal channel. One such system is described, for example, in U.S. Pat. No. 2,594,048. However, the prior art systems, such as the system described in the patent require extensive modifications of the receivers themselves to incorporate them into the receivers, and they are expensive to put into practice.

An objective of the present invention is to provide such an antenna rotating apparatus and system which is connected directly to a remote control unit for the wireless communication equipment, so that when any particular channel is selected by the remote control unit, the associated antenna is automatically rotated to a pre-set angular position which provides optimum signal strength for that channel. It will be appreciated that the foregoing is achieved without any need to change the circuitry of the wireless equipment itself in any manner.

In brief, the improved system of the invention automatically rotates the antenna of a television receiver, or other wireless communication equipment, to preselected angular positions as the television receiver is tuned by a remote control unit to different signal channels, so as to provide the best reception in each channel.

In the following specification, the concept of the invention will be described as applied to the control of a television receiver. It will become evident as the description proceeds, however, that the system may also be used in conjunction with other types of wireless equipment.

BRIEF DESCRIPTION OF THE DRAWING

The single FIGURE is a schematic diagram, partly in block form and partly in circuit detail, of a combined remote control for a television receiver and its associated antenna, which incorporates the concepts of the present invention.

DETAILED DESCRIPTION OF THE ILLUSTRATED EMBODIMENT

The system shown in the drawing includes a remote control unit 10 which may be of any usual type, and which may be used to control a television receiver 13 by ultrasonic, or other remote control means. The remote control unit 10 includes a number of buttons corresponding to the various television signal channels to be controlled by the unit. The unit may be of the type which generates a number of binary coded digital output signals respectively corresponding to the various signal channels, the digital output signals being generated as the various channel selection switches of the remote control unit are operated. Should the remote control unit 10 be of the type which generates an analog tuning voltage, an analog-to-digital converter is incorporated into the system, so that the analog tuning voltage may be transformed into binary coded digital signals representing different values of the analog tuning voltage. The binary coded digital signals generated by the remote control unit 10 are designated $A_0$–$A_7$, and these signals are introduced to a random access memory 12 and are used to address various memory locations in the memory. Random access memory 12 may be an integrated circuit of the type designated generally in the art as 4045.

The remote control unit may also include a usual on/off switch and a volume control, as illustrated. The on/off switch is used to turn the television receiver 13 on and off, and the volume control is used to control the volume of the television receiver, in a manner known to the art.

The television receiver 13 has an antenna 11 associated therewith, and the antenna may be rotated by means of an appropriate coupling 15 which contains, or is mechanically coupled to an electric motor 16. The electric motor has a pair of field coils, and is driven in a clockwise or counterclockwise direction, depending upon which of the field coils is energized.

The motor 16 is mechanically coupled to an interrupter switch 14, and switch 14 opens and closes as the motor rotates, so that a pair of interconnected input terminals of "nand" gates 20 and 22 are intermittently connected and disconnected to ground so that effectively a pulsating signal is generated by the switch 14 as the motor 16 rotates antenna 11, these pulses indicating successive angular positions of the antenna during each revolution.

The "nand" gates are connected to a reversible updown counter 18, and when "nand" gate 20 is enabled, the pulses produced by the contactor switch 40 cause the counter 18 to count in one direction. Alternately, when the "nand" gate 22 is enabled, the pulsations produced by the interrupter switch 14 cause the counter 18 to count in the opposite direction. Counter 18 may be any commercially available integrated circuit constituting an updown counter, such as marketed by Sylvania Electric Products and designated SM180.

The reversible counter supplies binary coded digital signals to the random access memory 12 and to a digital comparator 19. Digital comparator 19 may be actually two four-bit magnitude TTL integrated circuit digital comparators of the type designated SN54L85 manufactured by Texas Instruments, the two comparators being connected in cascade. Outputs $A>B$ and $A<B$ from the comparators are used to drive the gates 31 and 33 so as to rotate the antenna 11 in the clockwise or counter-clockwise directions. The reversible counter 18 includes a reset switch 38 which is connected to ground. Random access memory 12 also introduces binary coded digital data signals to the digital comparator 19, these data signals being designated $D_0$–$D_7$.

A switch 40 is connected to the random access memory 12. When the switch 40 is in a "write" position the memory is conditioned to receive data, and when the switch is placed in a "read" position the memory is conditioned to output data to the digital comparator. The comparator develops a first output when the binary coded digital output from counter 18 is less than the output from memory 12, and the comparator develops a second output when the output from counter 18 is greater than the output from memory 12.

The two outputs of digital comparator 19 are introduced respectively to a pair of "or" gates 31 and 33. A pair of grounded switches 30 and 32 are also respectively connected to the "or" gates. The outputs of th "or" gates are respectively connected through relays 34 and 36 to the positive terminal of an appropriate source of direct current exciting potential. The relays 34 and 36 have respective contacts in the leads to the field coils of motor 16, the leads being connected to the secondary of a transformer T1 whose primary is connected to the usual 60 Hertz alternating current mains.

In order to program the illustrated system, the switch 30 is first closed which energizes relay 34 and causes the motor 16 to rotate the antenna 12 in a counerclockwise direction to its extreme counterclockwise position. The reset switch 38 is then operated to set the counter 18 to zero. Then, the television receiver 13 is tuned to a first signal channel, and switch 32 is closed to turn the antenna 11 in a clockwise direction to a position at which maximum signal is received by the receiver 13. The switch switch 32 is then opened and switch 40 is moved to the "write" position, so that the binary coded digital signal from reversible counter 18, which corresponds to the particular angular position of antenna 11 corresponding to the first signal channel, may be entered into the random access memory 12. This procedure is then repeated for each signal channel which is to be tuned by the remote control unit.

The switch 40 is then set to the "read" position, for normal operation of the system. Then, to tune in any particular signal channel, the corresponding channel selection switch in the remote control unit 10 is operated, and the actuation of this switch causes the television receiver 13 to be tuned to the selected channel. The actuation of the switch also addresses the location in memory 12 at which data corresponding to the antenna angular position for that channel is stored. The data appears on the leads designated $D_0$–$D_7$, and is introduced to digital comparator 19. Depending on the previous setting of reversible counter 18, the digital comparator will develop an output at "or" gate 31 or at "or" gate 33, and the resulting output will cause the motor 16 to turn the antenna 11 in a direction such that the count of the counter 18 increases or decreases until equality with the binary coded digital signal from memory 12 is achieved, at which point the motor will be de-energized, and the antenna will be set to the desired angular position for maximum signal strength.

The operation described above is repeated each time any one of the channel selection switches of the remote control unit 10 is operated. In each case, the antenna 11 will be rotated in a direction, clockwise or counterclockwise, determined by the shorter angular distance to the desired setting, as detected by the system, until the angular position of maximum signal strength is reached.

The invention provides, therefore, a simple system which is adapted to be connected to a remote control unit, and which provides a control for the television receiver antenna 11, without in any way requiring any modification to the receiver itself.

It will be appreciated that while a particular embodiment of the invention has been shown and described, modifications may be made. It is intended in the claims to cover the modifications which come within the spirit and scope of the invention.

What is claimed is:

1. In combination with a remote control unit for wireless equipment which is capable of tuning the equipment to any one of a plurality of pre-selected signal channels, said remote control unit generating binary-coded signals representative of the plurality of pre-selected signal channels, and control apparatus connected to said remote control unit for causing the antenna associated with said wireless equipment to be rotated to pre-selected angular positions so as to provide optimum processing of signals in each of the pre-selected signal channels, said wireless equipment having an associated antenna and said control apparatus including: an electric motor coupled to the antenna for rotating the antenna to pre-selected angular positions; means mechanically connected to the motor for generating electrical signals indicative of the pre-selected angular positions as the antenna rotates; binary counter means electrically connected to the generating means for generating binary signals in response to said electrical signal; memory means electrically connected to the counter means for storing the binary signals from the counter means corresponding to pre-selected angular positions of the antenna in predetermined address locations in the memory means, and said memory means being electrically connected to said remote control unit and responsive to the binary signals therefrom selectively to address the binary signals stored in the memory means at the pre-selected memory locations; comparator means connected to the memory means and to the counter; and control and drive circuitry connecting said comparator means to said electric motor to cause the electric motor to rotate the antenna to the pre-selected angular positions.

2. The combination defined in claim 1, in which said control and drive circuitry includes logic circuitry for causing the electric motor to be driven in either a clockwise or counterclockwise direction depending upon the output of the comparator.

3. The combination defined in claim 2, in which said binary counter means is an up-down reversible counter, and which includes logic circuitry connecting the output of the comparator to the counter means to cause the counter means to count up or down depending upon the output of the comparator means.

* * * * *